US012701342B2

(12) United States Patent
Nakagawa

(10) Patent No.: US 12,701,342 B2
(45) Date of Patent: Aug. 4, 2026

(54) SOLID-STATE IMAGING ELEMENT AND ELECTRONIC EQUIPMENT INCLUDING SHARED PIXEL UNITS

(71) Applicant: SONY SEMICONDUCTOR SOLUTIONS CORPORATION, Kanagawa (JP)

(72) Inventor: Shinji Nakagawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 57 days.

(21) Appl. No.: 18/693,287

(22) PCT Filed: Mar. 24, 2022

(86) PCT No.: PCT/JP2022/013975
§ 371 (c)(1),
(2) Date: Mar. 19, 2024

(87) PCT Pub. No.: WO2023/053532
PCT Pub. Date: Apr. 6, 2023

(65) Prior Publication Data
US 2024/0388817 A1 Nov. 21, 2024

(30) Foreign Application Priority Data
Sep. 30, 2021 (JP) ................................. 2021-160955

(51) Int. Cl.
*H04N 25/778* (2023.01)
*H10F 39/00* (2025.01)
*H04N 25/76* (2023.01)

(52) U.S. Cl.
CPC ....... *H04N 25/778* (2023.01); *H10F 39/8027* (2025.01); *H10F 39/8063* (2025.01); *H04N 25/7795* (2023.01)

(58) Field of Classification Search
CPC .. H04N 25/46; H04N 25/778; H04N 25/7795; H04N 25/78; H10F 39/802; H10F 39/8027; H10F 39/8063; H10F 39/813
See application file for complete search history.

(56) References Cited

U.S. PATENT DOCUMENTS 9,224,778 B2 * 12/2015 Wakano ................. H10F 39/813
2014/0239433 A1 * 8/2014 Wakano ................. H10F 39/813
257/443

FOREIGN PATENT DOCUMENTS

JP 2010-093653 A 4/2010
JP 2015019388 A * 1/2015
(Continued)

OTHER PUBLICATIONS

International Search Report and Written Opinion of PCT Application No. PCT/JP2022/013975, issued on Jun. 14, 2022, 10 pages of ISRWO.

*Primary Examiner* — Antoinette T Spinks
(74) *Attorney, Agent, or Firm* — CHIP LAW GROUP

(57) ABSTRACT

Provided is a solid-state imaging element that includes shared pixel units that are disposed adjacent to each other in a horizontal direction and configured to allow a plurality of pixels to share an FD section and an amplification transistor. The shared pixel units each include a first selection transistor and a second selection transistor. The first selection transistor connects the amplification transistor to a first vertical signal line which is used when pixel signals are outputted independently for each of the pixels. The second selection transistor connects the amplification transistor to a second vertical signal line which is used when source follower addition is performed to output the pixel signals.

7 Claims, 18 Drawing Sheets

(56)            References Cited

FOREIGN PATENT DOCUMENTS

| JP | 2016-005068 | A | | 1/2016 |
| JP | 2020080377 | A | * | 5/2020 |
| WO | 2018/181583 | A1 | | 10/2018 |

* cited by examiner

F I G . 1
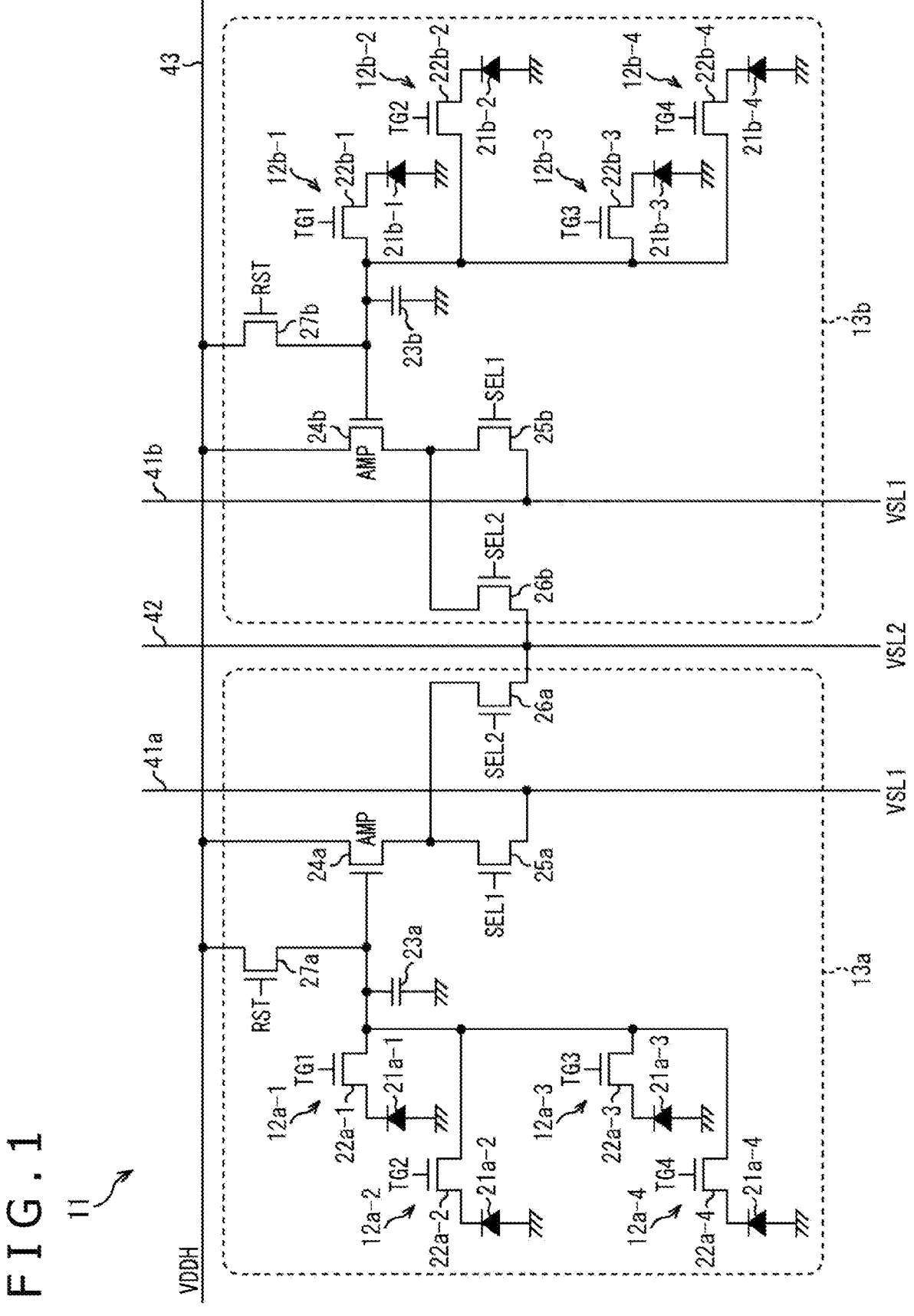

F I G . 2
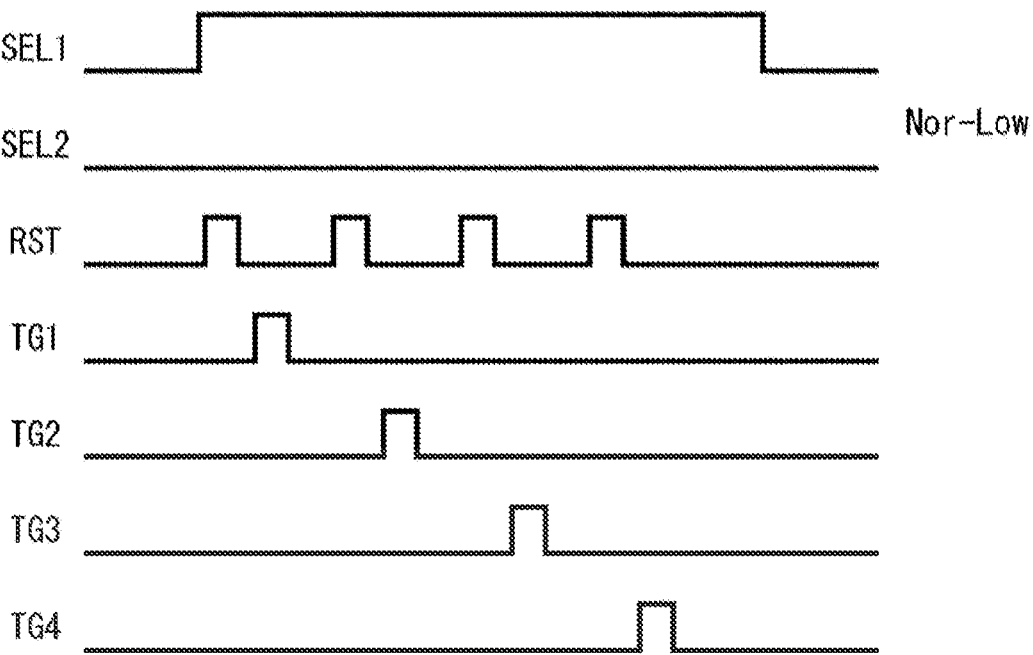

F I G . 5
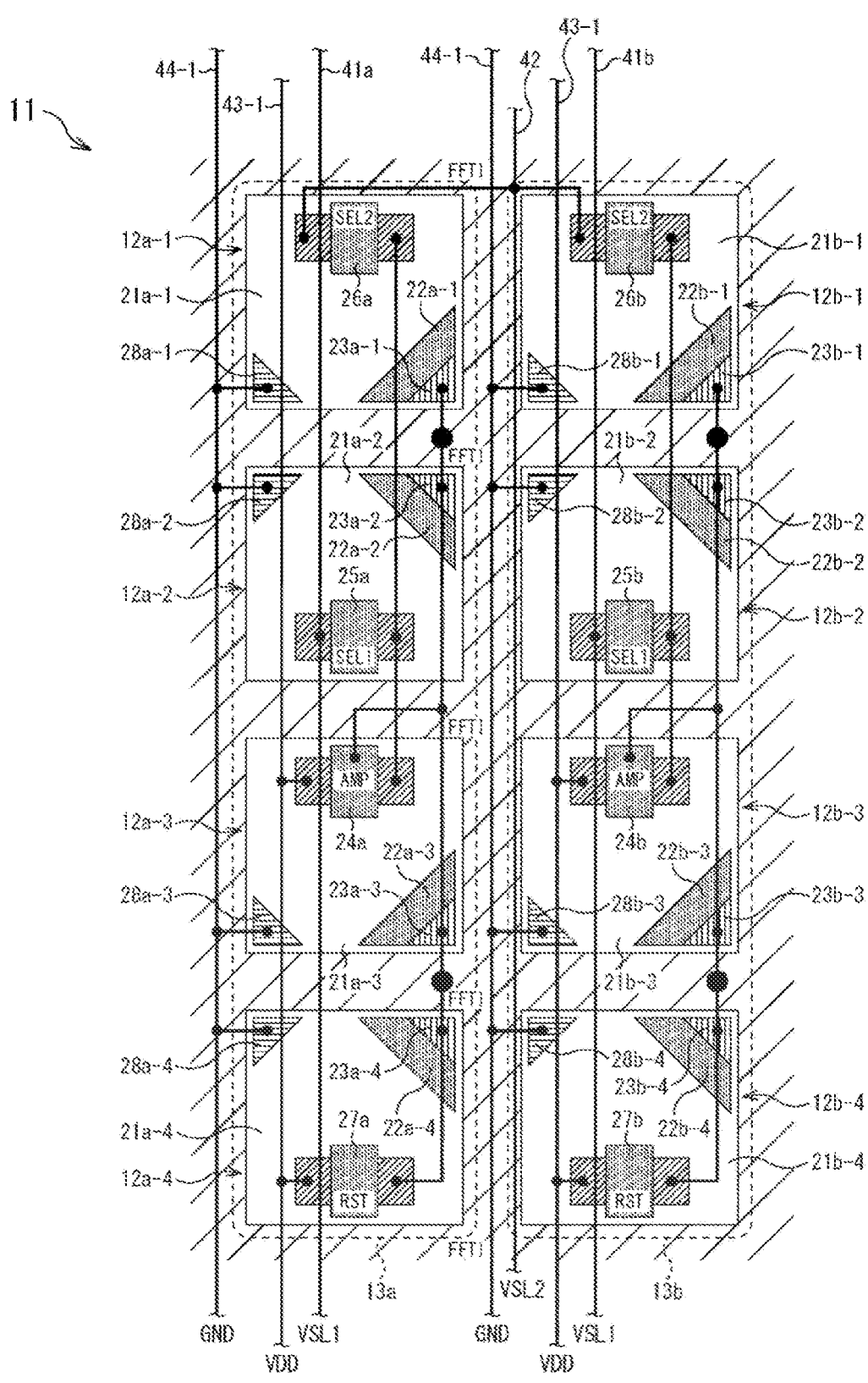

F I G . 8
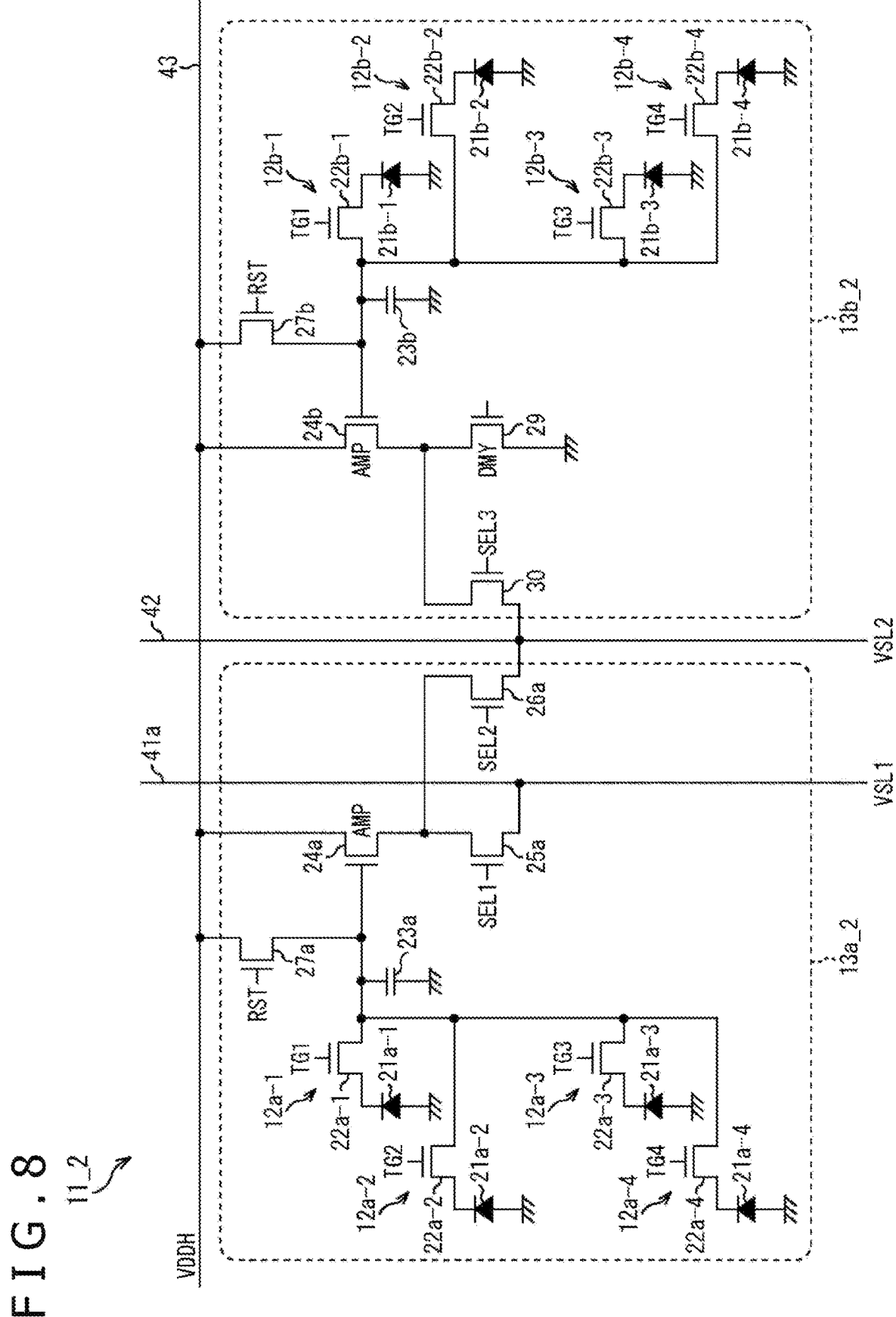

F I G . 9
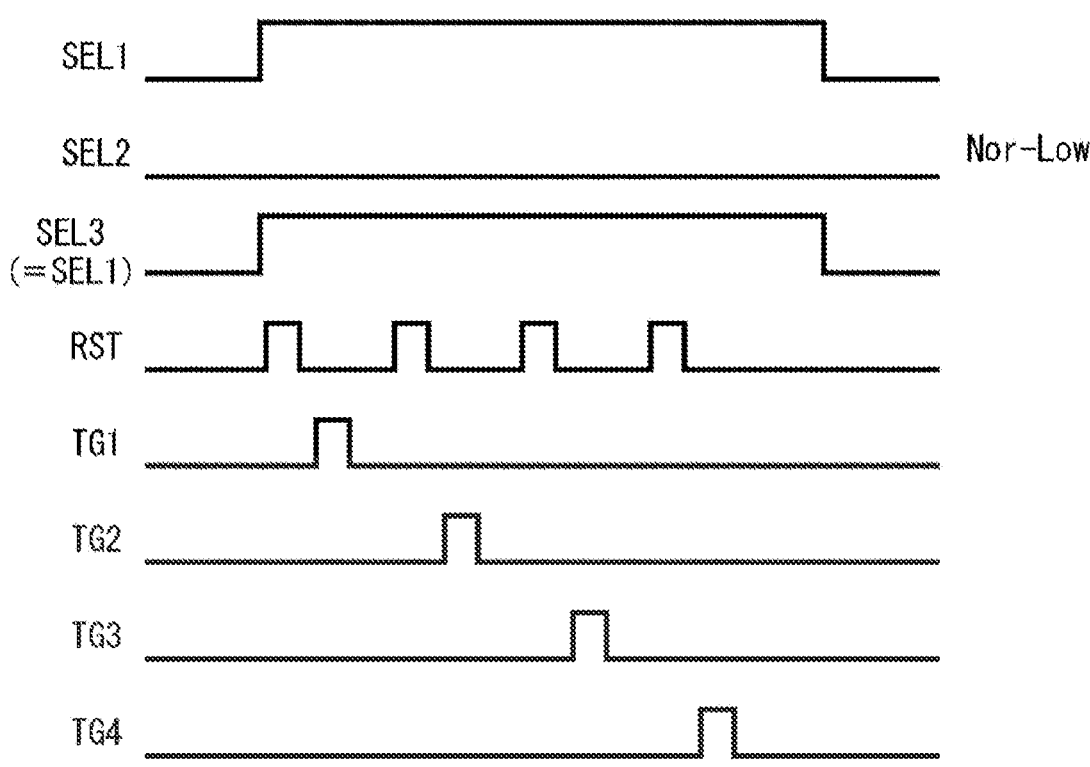

F I G . 1 0
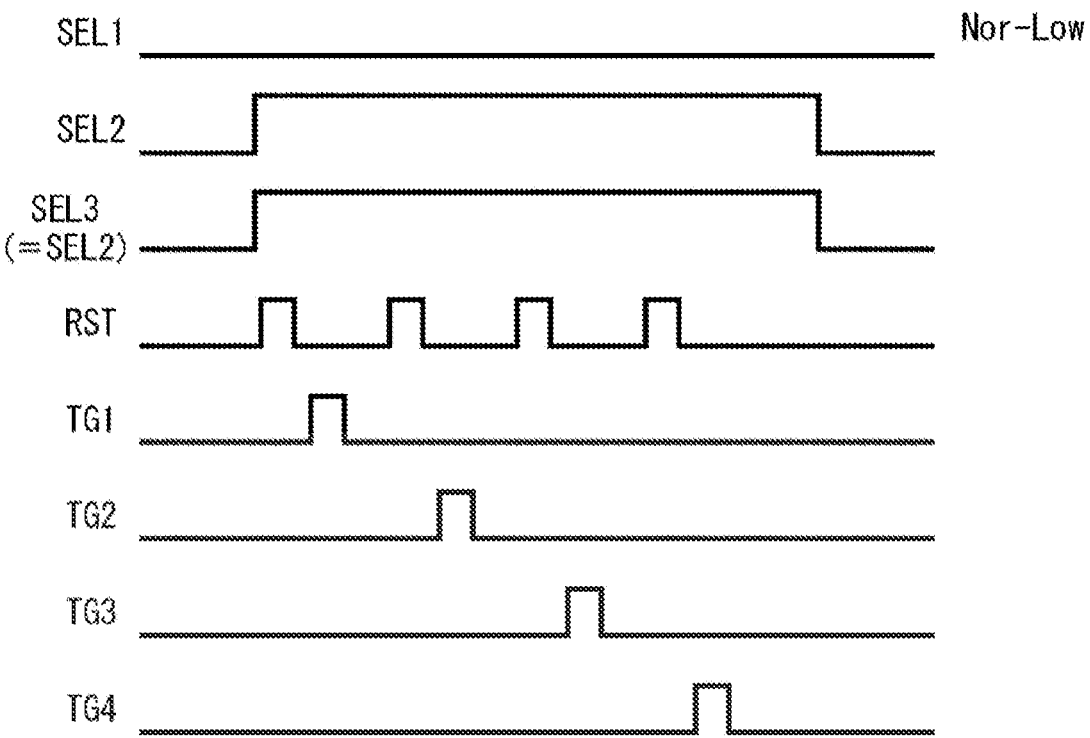

F I G . 1 3
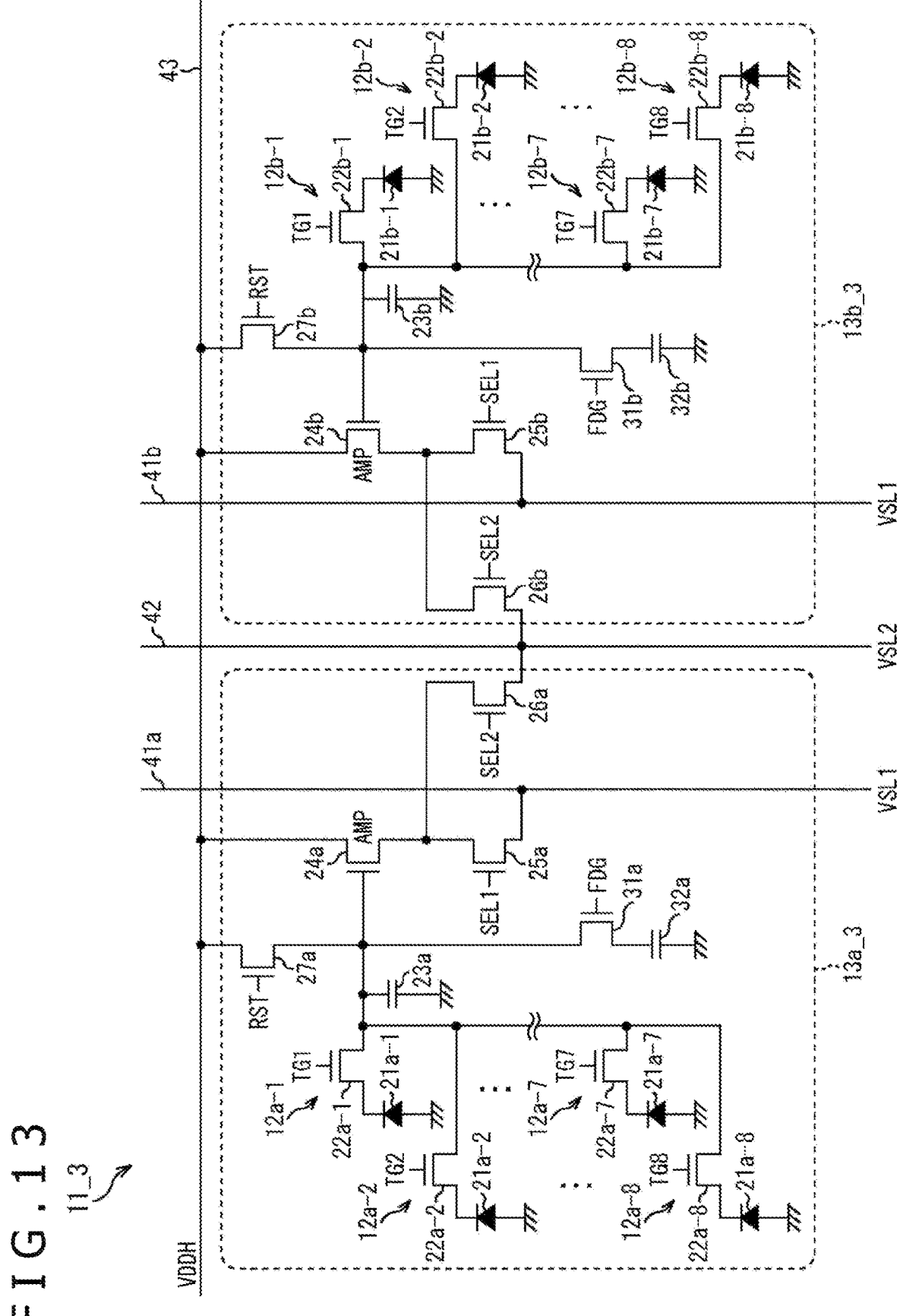

F I G . 1 4
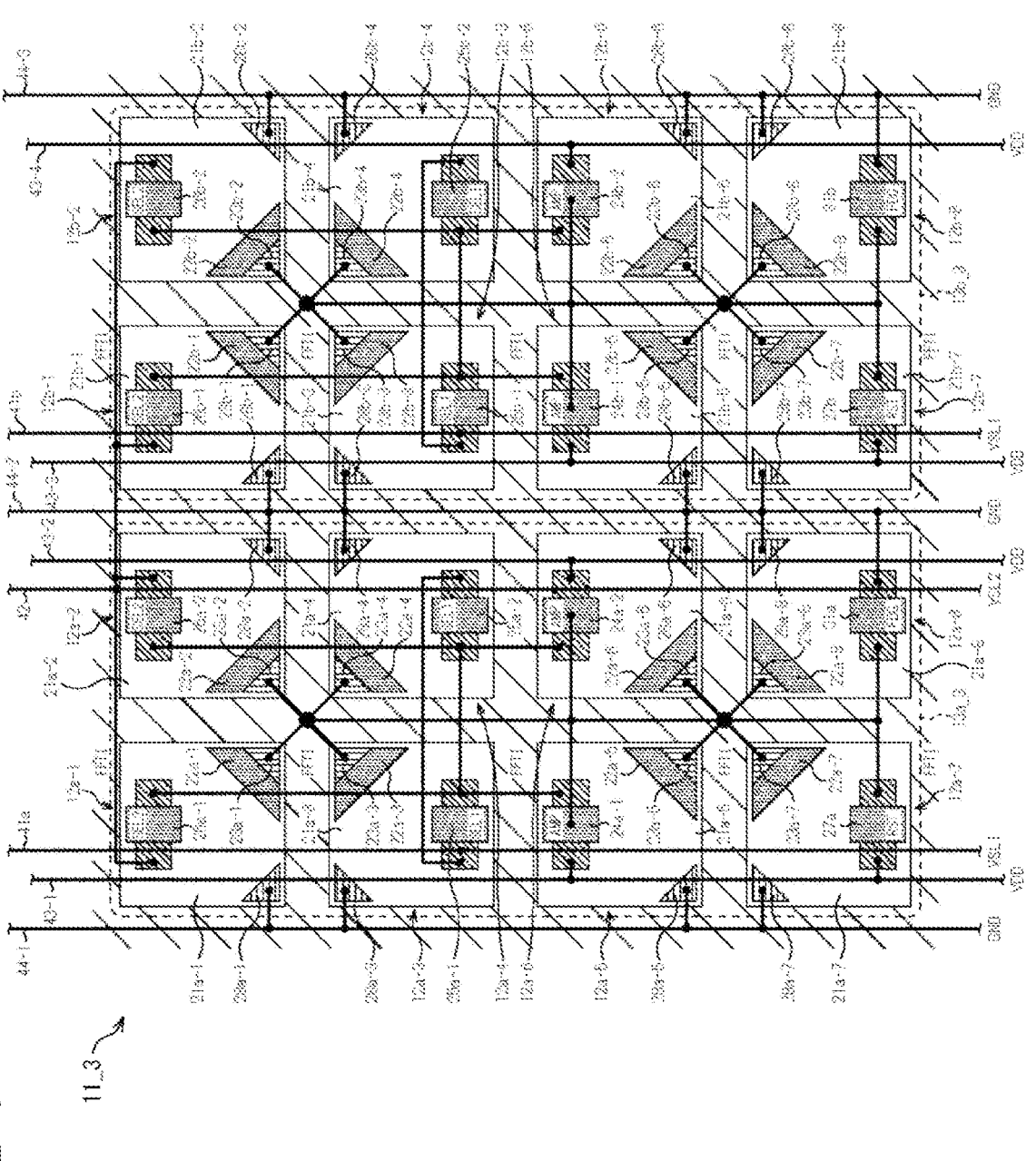

F I G . 1 5

F I G . 1 6
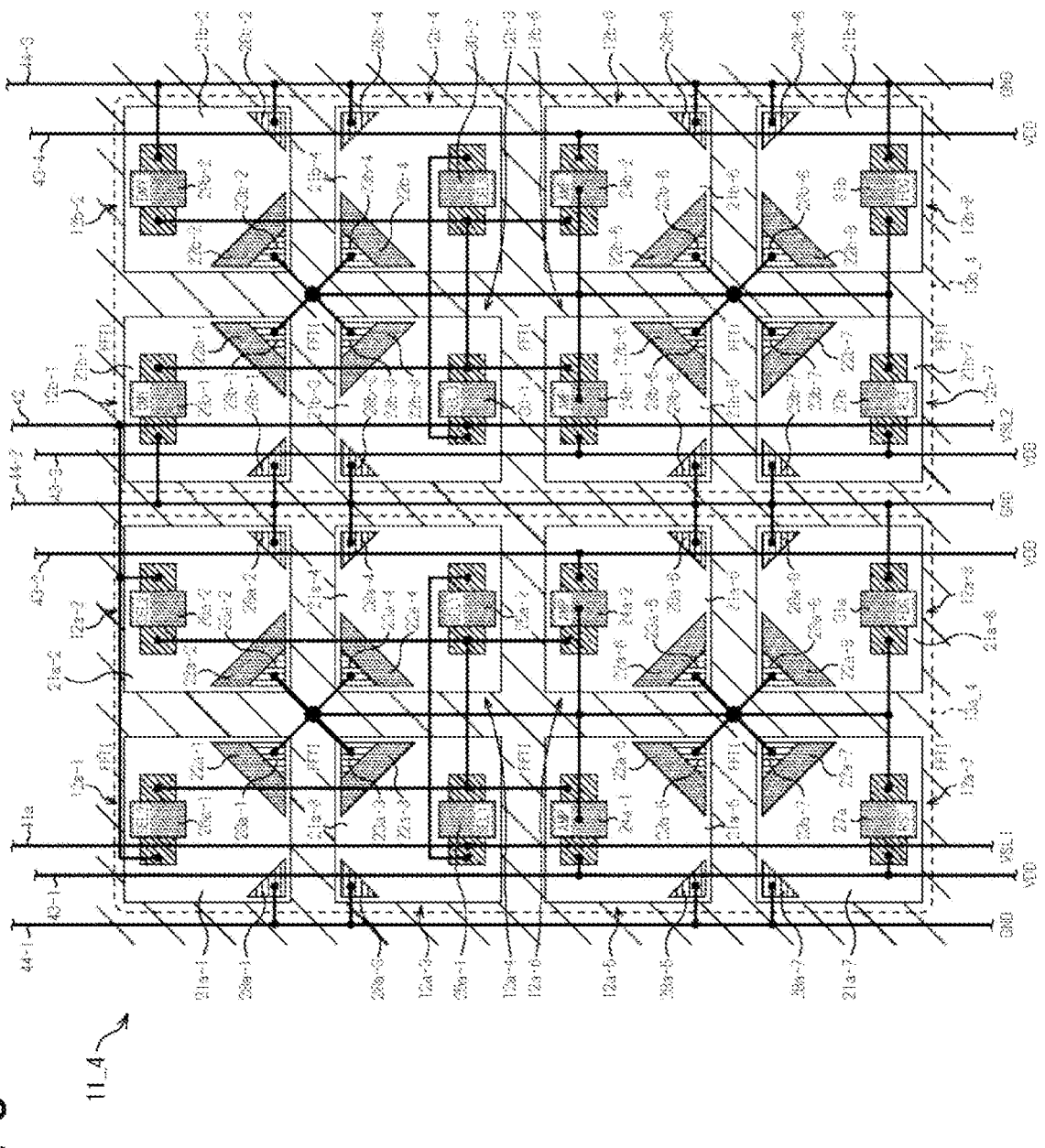

SOLID-STATE IMAGING ELEMENT AND ELECTRONIC EQUIPMENT INCLUDING SHARED PIXEL UNITS

CROSS REFERENCE TO RELATED APPLICATIONS

This application is a U.S. National Phase of International Patent Application No. PCT/JP2022/013975 filed on Mar. 24, 2022, which claims priority benefit of Japanese Patent Application No. JP 2021-160955 filed in the Japan Patent Office on Sep. 30, 2021. Each of the above-referenced applications is hereby incorporated herein by reference in its entirety.

TECHNICAL FIELD

The present disclosure relates to a solid-state imaging element and electronic equipment, and more particularly relates to a solid-state imaging element and electronic equipment that are able to achieve higher performance.

BACKGROUND ART

For example, FD (Floating Diffusion) addition and SF (Source Follower) addition are conventionally known as technologies for adding a plurality of pixel signals in a solid-state imaging element such as a CMOS (Complementary Metal Oxide Semiconductor) image sensor.

Disclosed, for example, in PTL 1 is a technology for inhibiting the occurrence of false colors and preventing a decrease in resolution when SF addition is performed by a load MOS circuit connected to a readout signal line.

CITATION LIST

Patent Literature

[PTL 1]
    Japanese Patent Laid-open No. 2010-093653

SUMMARY

Technical Problem

Incidentally, switching between SF addition and independent readout, in which pixel signals are read out without being added, is conventionally performed by controlling the clock of a selection transistor that switches connection to one vertical signal line shared by a plurality of pixels. Therefore, when independent readout of pixel signals is performed, one vertical signal line is used alternately to output the pixel signals. As a result, an increased amount of time is required to read out one horizontal period. Consequently, there is a concern, for example, that the frame rate will decrease.

Further, in a case where FD addition of pixel signals is performed, additional capacitance is required to increase the load capacitance of an FD section. However, as the number of shared pixels increases, it may become difficult to increase the load capacitance as needed to receive more electric charge.

Consequently, it is demanded that a higher-performance solid-state imaging element be provided without increasing the time required for reading out one horizontal period and without increasing the capacitance for FD addition.

In view of the above circumstances, the present disclosure has been made to achieve higher performance.

Solution to Problem

A solid-state imaging element according to an aspect of the present disclosure is configured such that shared pixel units are disposed adjacent to each other in a horizontal direction. The shared pixel units allow a plurality of pixels to share an FD section and an amplification transistor. The shared pixel units each include a first selection transistor and a second selection transistor. The first selection transistor connects the amplification transistor to a first vertical signal line which is used when pixel signals are outputted independently for each of the pixels. The second selection transistor connects the amplification transistor to a second vertical signal line which is used when source follower addition is performed to output the pixel signals.

Electronic equipment according to an aspect of the present disclosure includes a solid-state imaging element. The solid-state imaging element is configured such that shared pixel units are disposed adjacent to each other in a horizontal direction. The shared pixel units allow a plurality of pixels to share an FD section and an amplification transistor. The shared pixel units each include a first selection transistor and a second selection transistor. The first selection transistor connects the amplification transistor to a first vertical signal line which is used when pixel signals are outputted independently for each of the pixels. The second selection transistor connects the amplification transistor to a second vertical signal line which is used when source follower addition is performed to output the pixel signals.

In an aspect of the present disclosure, shared pixel units are disposed adjacent to each other in a horizontal direction. The shared pixel units allow a plurality of pixels to share an FD section and an amplification transistor. The shared pixel units are each provided with a first selection transistor and a second selection transistor. The first selection transistor connects the amplification transistor to a first vertical signal line which is used when pixel signals are outputted independently for each of the pixels. The second selection transistor connects the amplification transistor to a second vertical signal line which is used when source follower addition is performed to output the pixel signals.

BRIEF DESCRIPTION OF DRAWINGS

FIG. 1 is a circuit diagram illustrating an example of the configuration of a first embodiment of an imaging element to which the present technology is applied.

FIG. 2 is a diagram illustrating an example of a timing diagram depicting a normal driving state.

FIG. 5 is a diagram illustrating an example of a second planar layout of the imaging element depicted in FIG. 1.

FIG. 8 is a circuit diagram illustrating an example of the configuration of a second embodiment of the imaging element to which the present technology is applied.

FIG. 9 is a diagram illustrating an example of the timing diagram depicting the normal driving state.

FIG. 10 is a diagram illustrating an example of the timing diagram depicting the SF addition driving state.

FIG. 13 is a circuit diagram illustrating an example of the configuration of a third embodiment of the imaging element to which the present technology is applied.

FIG. 14 is a diagram illustrating an example of a planar layout of the imaging element depicted in FIG. 13.

FIG. 15 is a circuit diagram illustrating an example of the configuration of a fourth embodiment of the imaging element to which the present technology is applied.

FIG. 16 is a diagram illustrating an example of the planar layout of the imaging element depicted in FIG. 15.

DESCRIPTION OF EMBODIMENTS

Figure 3:
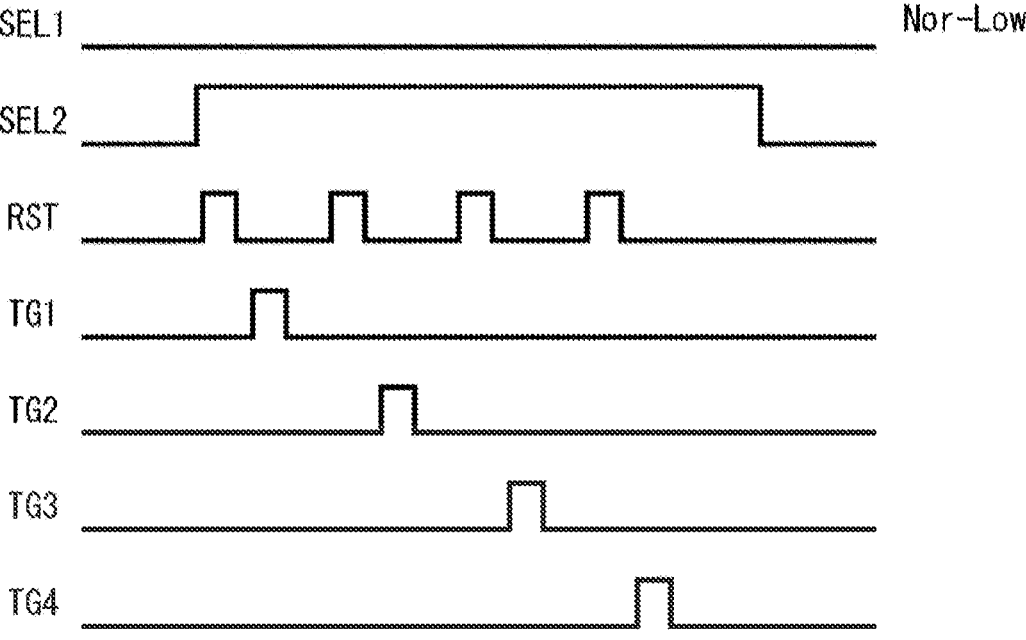
FIG. 3 is a diagram illustrating an example of a timing diagram depicting an SF addition driving state.

Specific embodiments to which the present technology is applied will now be described in detail with reference to the accompanying drawings.

First Example Configuration of Imaging Element

Figure 1:
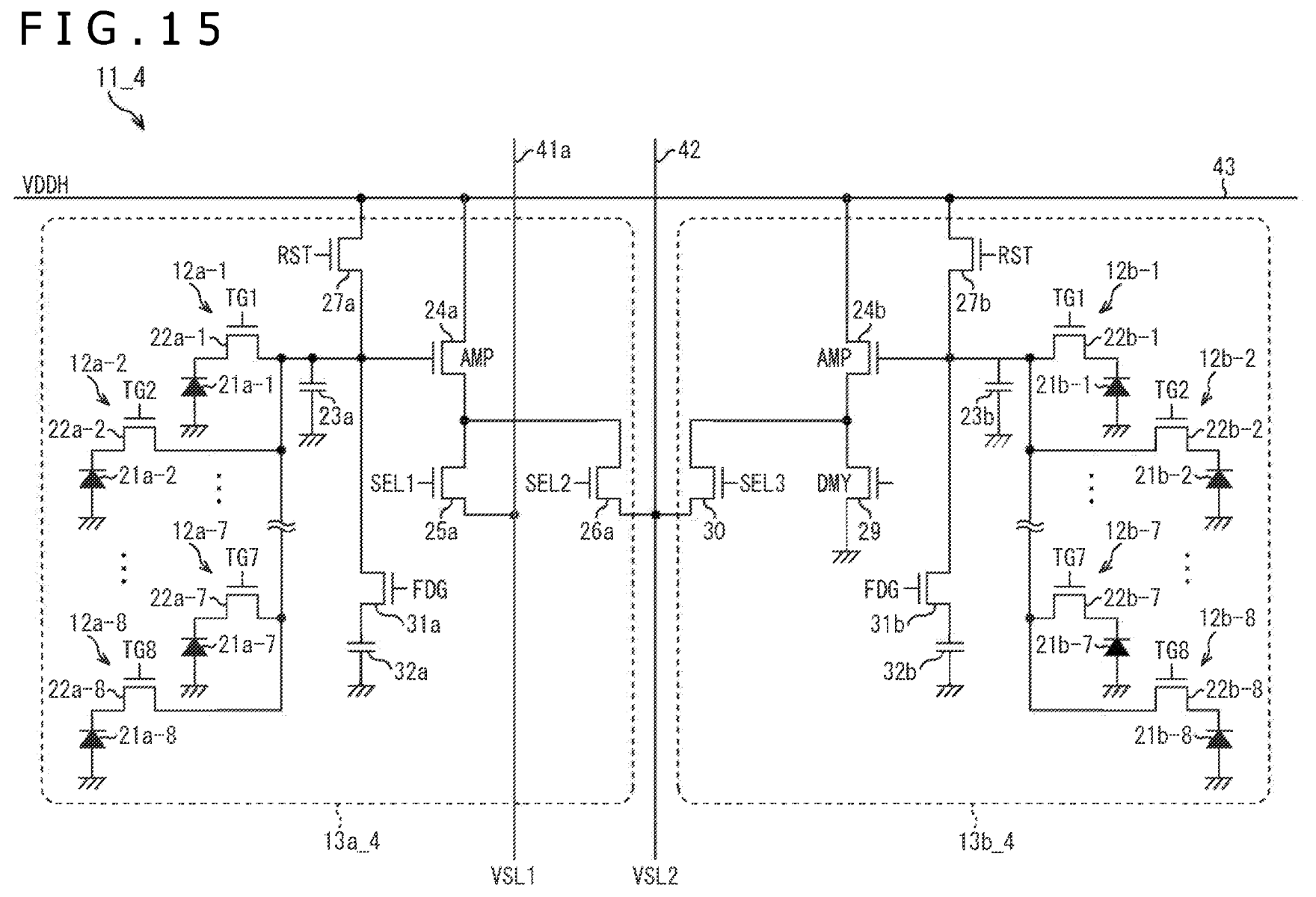

FIG. 1 is a circuit diagram illustrating an example of the configuration of a first embodiment of an imaging element to which the present technology is applied.

As depicted in FIG. 1, the imaging element 11 includes a plurality of pixels 12. Further, the imaging element 11 has a pixel sharing structure in which a predetermined number of pixels 12, namely, four pixels 12-1 to 12-4 in the example depicted in FIG. 1, share a main FD section 23 and an amplification transistor 24. A unit of the predetermined number of pixels 12 having such a pixel sharing structure is hereinafter referred to as a shared pixel unit 13. In the example depicted in FIG. 1, a shared pixel unit 13a and a shared pixel unit 13b are disposed adjacent to each other in a horizontal direction.

The imaging element 11 is able to output pixel signals corresponding to electric charge generated in the pixels 12-1 to 12-4 by a driving method of reading out each of the pixel signals independently (hereinafter referred to as normal driving) or by a driving method of adding the pixel signals through the use of a source follower (hereinafter referred to as SF addition driving). In a normal driving state, the pixel signals are read out through a vertical signal line 41. In an SF addition driving state, the pixel signals are read out through a vertical signal line 42.

Further, the imaging element 11 is configured such that the same vertical signal line 42 is used by the two horizontally adjacent shared pixel units 13a and 13b in the SF addition driving state. It should be noted that the shared pixel units 13a and 13b have the same structure. In a case where there is no need to distinguish between the shared pixel unit 13a and the shared pixel unit 13b, each of them is referred to as the shared pixel unit 13, and this similarly applies to each part included in the shared pixel unit 13.

The shared pixel unit 13 includes four photodiodes 21-1 to 21-4, four transfer transistors 22-1 to 22-4, the main FD section 23, the amplification transistor 24, a first selection transistor 25, a second selection transistor 26, and a reset transistor 27.

The photodiodes 21-1 to 21-4 are configured such that their anode terminals are grounded and that their cathode terminals are connected to the main FD section 23 through the transfer transistors 22-1 to 22-4. The main FD section 23 is connected to the gate electrode of the amplification transistor 24 and connected to a power supply wiring 43 through the reset transistor 27. The drain of the amplification transistor 24 is connected to the power supply wiring 43, and the source of the amplification transistor 24 is connected to the vertical signal line 41 through the first selection transistor 25 and connected to the vertical signal line 42 through the second selection transistor 26.

The photodiodes 21 generate electric charge by photoelectric conversion. The transfer transistors 22 transfer the electric charge accumulated in the photodiodes 21 to the main FD section 23 in accordance with a transfer signal TG. Subsequently, the electric charge accumulated in the main FD section 23 is amplified by the amplification transistor 24, and a pixel signal corresponding to the amplified electric charge is generated. In the normal driving state, the first selection transistor 25 is turned on in accordance with a selection signal SEL1, the amplification transistor 24 is connected to the vertical signal line 41, and the pixel signal is read out through the vertical signal line 41. In the SF addition driving state, the second selection transistor 26 is turned on in accordance with a selection signal SEL2, the amplification transistor 24 is connected to the vertical signal line 42, and the pixel signal is read out through the vertical signal line 42.

FIG. 2 is a diagram illustrating an example of a drive signal for the imaging element 11 in the normal driving state.

In the normal driving state, when it is time to read out the pixel signals from the shared pixel units 13a and 13b, the selection signal SEL1 goes high so as to turn on first selection transistors 25a and 25b. It should be noted that the selection signal SEL2 remains low in the normal driving state.

When the selection signal SEL1 goes high, reset transistors 27a and 27b are turned on in accordance with a reset signal RST that goes high in a pulsatile manner, and the electric charge accumulated in main FD sections 23a and 23b is discharged to the power supply wiring 43. Consequently, a pixel signal in the reset state is outputted to a vertical signal line 41a through the first selection transistor 25a and is outputted to a vertical signal line 41b through the first selection transistor 25b.

Subsequently, transfer transistors 22a-1 and 22b-1 are turned on in accordance with a transfer signal TG1 that goes high in a pulsatile manner. Then, the electric charge accumulated in a photodiode 21a-1 is transferred to the main FD section 23a, and the electric charge accumulated in a photodiode 21b-1 is transferred to the main FD section 23b. Consequently, a pixel signal corresponding to the electric charge generated in the photodiode 21a-1 is outputted to the vertical signal line 41a through the first selection transistor 25a, and a pixel signal corresponding to the electric charge generated in the photodiode 21b-1 is outputted to the vertical signal line 41b through the first selection transistor 25b.

Then, similarly, the reset signal RST and transfer signals TG2 to TG4 sequentially go high in a pulsatile manner. Consequently, a pixel signal corresponding to the electric charge generated in photodiodes 21a-2 to 21a-4 is outputted to the vertical signal line 41a through the first selection transistor 25a, and a pixel signal corresponding to the electric charge generated in the photodiodes 21b-2 to 21b-4 is outputted to the vertical signal line 41b through the first selection transistor 25b. Subsequently, the selection signal SEL1 goes low.

FIG. 3 is a diagram illustrating an example of a drive signal for the imaging element 11 in the SF addition driving state.

In the SF addition driving state, when it is time to read out the pixel signals from the shared pixel units 13a and 13b, the selection signal SEL2 goes high so as to turn on second selection transistors 26a and 26b. It should be noted that the selection signal SEL1 remains low in the SF addition driving state.

When the selection signal SEL2 goes high, the reset transistors 27a and 27b are turned on in accordance with the reset signal RST, which goes high in a pulsatile manner, and the electric charge accumulated in the main FD sections 23a and 23b is discharged to the power supply wiring 43. Consequently, a pixel signal in the reset state is outputted to the vertical signal line 42 through the second selection transistor 26a and is simultaneously outputted to the vertical signal line 42 through the second selection transistor 26b. Then, source follower addition is performed on such outputted pixel signals.

Subsequently, the transfer transistors 22a-1 and 22b-1 are turned on in accordance with the transfer signal TG1, which goes high in a pulsatile manner. Then, the electric charge accumulated in the photodiode 21a-1 is transferred to the main FD section 23a, and the electric charge accumulated in the photodiode 21b-1 is transferred to the main FD section 23b. Consequently, a pixel signal corresponding to the electric charge generated in the photodiode 21a-1 is outputted to the vertical signal line 42 through the second selection transistor 26a, and a pixel signal corresponding to the electric charge generated in the photodiode 21b-1 is simultaneously outputted to the vertical signal line 42 through the second selection transistor 26b. Then, source follower addition is performed on such outputted pixel signals.

Then, similarly, the reset signal RST and the transfer signals TG2 to TG4 sequentially go high in a pulsatile manner. Consequently, a pixel signal corresponding to the electric charge generated in the photodiodes 21a-2 to 21a-4 and a pixel signal corresponding to the electric charge generated in the photodiodes 21b-2 to 21b-4 are simultaneously outputted to the vertical signal line 42 at respective time points. Then, source follower addition is performed on such outputted pixel signals. Subsequently, the selection signal SEL2 goes low.

The imaging element 11 is configured as described above. Accordingly, in the normal driving state, the imaging element 11 is able to output a pixel signal from the shared pixel unit 13a through the vertical signal line 41a and output a pixel signal from the shared pixel unit 13b through the vertical signal line 41b. As a result, in contrast, for example, to a conventional imaging element that outputs pixel signals by alternately using one vertical signal line even in the normal driving state, the imaging element 11 is able to avoid an increase in the time required for reading out one horizontal period.

Stated differently, the imaging element 11 is configured such that the shared pixel units 13a and 13b are able to parallelly output pixel signals in the normal driving state.

Further, the imaging element 11 is able to add pixels by SF addition without requiring additional capacitance for FD addition. Furthermore, in the SF addition driving state, the imaging element 11 uses only the vertical signal line 42 and does not use the vertical signal lines 41a and 41b. This decreases the electric current in the vertical signal lines 41a and 41b, and thus reduces power consumption. Moreover, the imaging element 11 is able to obtain images with a better S/N ratio than images obtained by simply compressing horizontal pixel signals to ½. Therefore, the imaging element 11 is able to achieve higher performance than a conventional imaging element.

Figure 4:
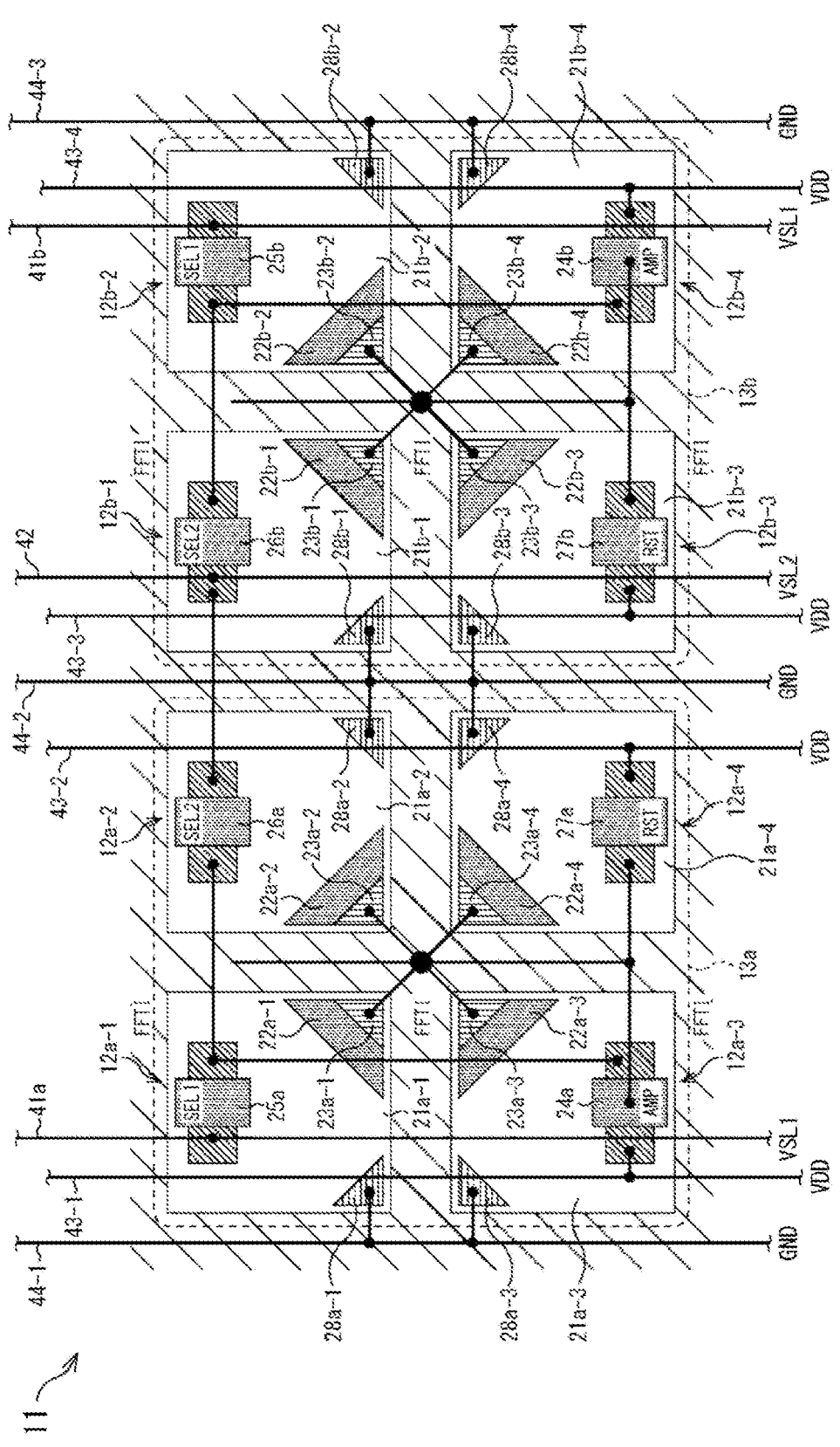
FIG. 4 is a diagram illustrating an example of a first planar layout of the imaging element depicted in FIG. 1.

FIG. 4 is a diagram illustrating an example of a first planar layout of the imaging element.

As depicted in FIG. 4, the first planar layout is organized in such a manner that four pixels 12-1 to 12-4 forming the shared pixel unit 13 are arranged in a 2×2 array. Further, the photodiodes 21 constituting the individual pixels 12 are separated by an element isolation section (FFTI) that is formed, for example, by a trench. Therefore, the photodiodes 21 are each provided with a P+ type region 28 for connection to a ground-level wiring 44. Furthermore, the main FD section 23 is divided into main FD sections 23-1 to 23-4, which are respectively provided for the photodiodes 21-1 to 21-4.

Moreover, in the imaging element 11, the shared pixel units 13a and 13b, which are disposed adjacent to each other in the horizontal direction, have transistors that are arranged symmetrically in the horizontal direction (left-right mirror-symmetrical arrangement).

For example, in the shared pixel unit 13a, an amplification transistor 24a is disposed in the photodiode 21a-3, which is on the lower left side, and in the shared pixel unit 13b, an amplification transistor 24b is disposed in the photodiode 21b-4, which is on the lower right side. Further, in the shared pixel unit 13a, the first selection transistor 25a is disposed in the photodiode 21a-1, which is on the upper left side, and in the shared pixel unit 13b, the first selection transistor 25b is disposed in the photodiode 21b-2, which is on the upper right side.

Similarly, in the shared pixel unit 13a, the second selection transistor 26a is disposed in the photodiode 21a-2, which is on the upper right side, and in the shared pixel unit 13b, the second selection transistor 26b is disposed in the photodiode 21b-1, which is on the upper left side. Further, in the shared pixel unit 13a, the reset transistor 27a is disposed in the photodiode 21a-4, which is on the lower right side, and in the shared pixel unit 13b, the reset transistor 27b is disposed in the photodiode 21b-3, which is on the lower left side.

In the imaging element 11, which is in the above-described planar layout, the vertical signal line 42 can be disposed in the center between the shared pixel units 13a and 13b, and the vertical signal lines 41a and 41b can be disposed near the outside. Therefore, the imaging element 11 is able to inhibit the occurrence of interference between the vertical signal lines 41a and 41b and the vertical signal line 42.

FIG. 5 is a diagram illustrating an example of a second planar layout of the imaging element 11.

As depicted in FIG. 5, the second planar layout is organized in such a manner that four pixels 12-1 to 12-4 forming the shared pixel unit 13 are arranged in a 1×4 array. The shared pixel units 13a and 13b are disposed adjacent to each other in the horizontal direction.

Incidentally, the imaging element 11 is able to collect light by using on-chip lenses stacked on a light-receiving surface. For example, in addition to a configuration in which an on-chip lens is disposed for each pixel 12, an on-chip lens may be disposed in each shared pixel unit 13 in which four pixels 12-1 to 12-4 are arranged in a 2×2 array. Further, an on-chip lens may be disposed for each of sixteen pixels 12 for which the shared pixel units 13 having four pixels 12-1 to 12-4 arranged in a 2×2 array are arranged in a 2×2 array.

Figure 6:
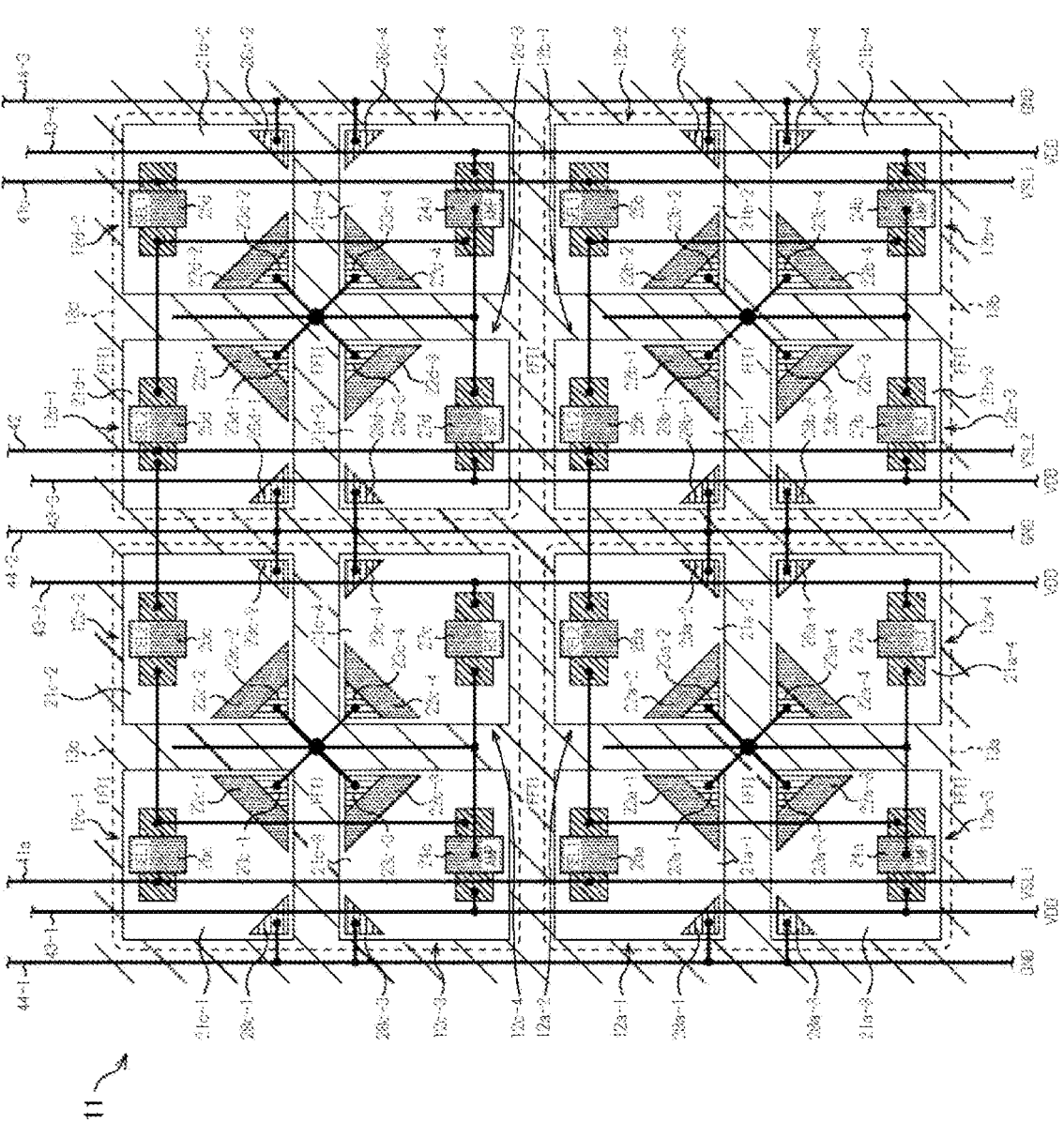
FIG. 6 is a diagram illustrating an example of the first planar layout of a 4×4 array.

FIG. 6 illustrates the first planar layout of the imaging element 11 in which shared pixel units 13a, 13b, 13c, and 13d are arranged in a 2×2 array and sixteen pixels 12 are arranged in a 4×4 array.

The shared pixel units 13a and 13b are configured such that the transistors are arranged symmetrically in the horizontal direction as described with reference to FIG. 4. Further, the shared pixel units 13c and 13d are also configured such that the transistors are arranged symmetrically in the horizontal direction, as is the case with the shared pixel units 13a and 13b.

Moreover, in the first planar layout, the shared pixel unit 13a and 13c, which are disposed vertically on the left side, have the same transistor arrangement, and the shared pixel units 13b and 13d, which are disposed vertically on the right side, have the same transistor arrangement.

Figure 7:
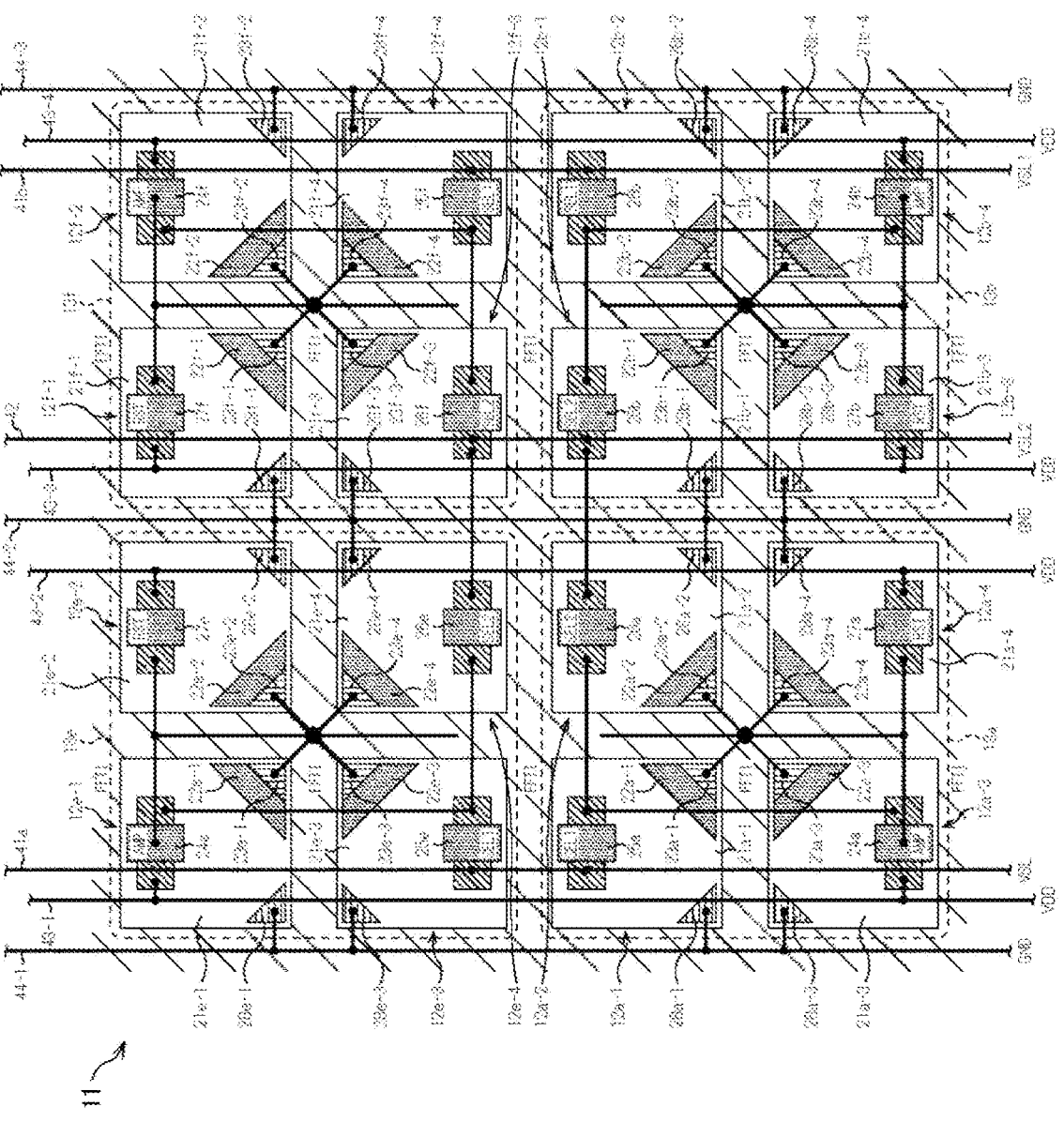
FIG. 7 is a diagram illustrating an example of the second planar layout of the 4×4 array.

FIG. 7 illustrates the planar layout of the imaging element 11 in which shared pixel units 13a, 13b, 13e, and 13f are arranged in a 2×2 array and sixteen pixels 12 are arranged in a 4×4 array.

The shared pixel units 13a and 13b are configured such that the transistors are arranged symmetrically in the horizontal direction as described with reference to FIG. 4. Further, the shared pixel units 13e and 13f are also configured such that the transistors are arranged symmetrically in the horizontal direction, as is the case with the shared pixel units 13a and 13b.

Moreover, in the second planar layout, the shared pixel units 13a and 13e, which are arranged vertically on the left side, are configured such that the transistors are arranged symmetrically in the vertical direction (up-down mirror-symmetrical arrangement).

For example, in the shared pixel unit 13a, the amplification transistor 24a is disposed in the photodiode 21a-3, which is on the lower left side, and in the shared pixel unit 13e, an amplification transistor 24e is disposed in a photodiode 21e-1, which is on the upper left side. Further, in the shared pixel unit 13a, the first selection transistor 25a is disposed in the photodiode 21a-1, which is on the upper left side, and in the shared pixel unit 13e, a first selection transistor 25e is disposed in a photodiode 21e-3, which is on the lower left side.

Similarly, in the shared pixel unit 13a, the second selection transistor 26a is disposed in the photodiode 21a-2, which is on the upper right side, and in the shared pixel unit 13e, a second selection transistor 26e is disposed in a photodiode 21e-4, which is on the lower right side. Further, in the shared pixel unit 13a, the reset transistor 27a is disposed in the photodiode 21a-4, which is on the lower right side, and in the shared pixel unit 13e, a reset transistor 27e is disposed in a photodiode 21e-2, which is on the upper right side.

Moreover, the shared pixel units 13b and 13f, which are arranged vertically on the right side, are similarly configured such that the transistors are arranged symmetrically in the vertical direction (up-down mirror-symmetrical arrangement).

Second Example Configuration of Imaging Element

FIG. 8 is a circuit diagram illustrating an example of the configuration of a second embodiment of the imaging element to which the present technology is applied. Components of the imaging element 11_2 depicted in FIG. 8 that are similar to the components of the imaging element 11 depicted in FIG. 1 are designated by the same reference signs as the corresponding components and will not be redundantly described in detail.

As depicted in FIG. 8, the imaging element 11_2 is configured such that shared pixel units 13a_2 and 13b_2 are adjacent to each other in the horizontal direction, as is the case with the imaging element 11 depicted in FIG. 1. Further, the shared pixel unit 13a_2 has the same configuration as the shared pixel unit 13a depicted in FIG. 1.

The configuration of the shared pixel unit 13b_2 is the same as the configuration of the shared pixel unit 13b depicted in FIG. 1 in that the former includes four photodiodes 21b-1 to 21b-4, four transfer transistors 22b-1 to 22b-4, the main FD section 23b, the amplification transistor 24b, and the reset transistor 27b. However, the configuration of the shared pixel unit 13b_2 is different from the configuration of the shared pixel unit 13b depicted in FIG. 1 in that a dummy transistor 29 and a third selection transistor 30 are disposed in place of the first selection transistor 25b and the second selection transistor 26b.

The dummy transistor 29 is not driven and is provided to maintain symmetry with the first selection transistor 25a of the shared pixel unit 13a_2.

In accordance with a selection signal SEL3, the third selection transistor 30 is driven in a manner similar to the first selection transistor 25a in the normal driving state and is driven in a manner similar to the second selection transistor 26a in the SF addition driving state.

Consequently, the shared pixel unit 13b_2 is configured such that the pixel signals are read out through the vertical signal line 42 in both the normal driving state and the SF addition driving state. More specifically, in the normal driving state, the imaging element 11_2 reads out the pixel signal of the shared pixel unit 13a_2 through the vertical signal line 41a, and reads out the pixel signal of the shared pixel unit 13b_2 through the vertical signal line 42. Meanwhile, in the SF addition driving state, the imaging element 11_2 simultaneously reads out the pixel signals of the shared pixel units 13a_2 and 13b_2 through the vertical signal line 42 and performs source follower addition on the read-out pixel signals.

FIG. 9 is a diagram illustrating an example of a drive signal for the imaging element 11_2 in the normal driving state.

In the normal driving state, when it is time to read out the pixel signals from the shared pixel units 13a_2 and 13b_2, the selection signals SEL1 and SEL3 go high so as to turn on the first selection transistor 25a and the third selection transistor 30. Stated differently, in the normal driving state, the selection signal SEL3 has the same waveform as the selection signal SEL1. It should be noted that the selection signal SEL2 remains low in the normal driving state.

When the selection signals SEL1 and SEL3 go high, the reset transistors 27a and 27b are turned on in accordance with the reset signal RST, which goes high in a pulsatile manner, and the electric charge accumulated in the main FD sections 23a and 23b is discharged to the power supply wiring 43. Consequently, a pixel signal in the reset state is outputted to the vertical signal line 41a through the first selection transistor 25a and is outputted to the vertical signal line 42 through the third selection transistor 30.

Subsequently, the transfer transistors 22a-1 and 22b-1 are turned on in accordance with the transfer signal TG1, which goes high in a pulsatile manner. Then, the electric charge accumulated in the photodiode 21a-1 is transferred to the main FD section 23a, and the electric charge accumulated in the photodiode 21b-1 is transferred to the main FD section 23b. Consequently, a pixel signal corresponding to the electric charge generated in the photodiode 21a-1 is outputted to the vertical signal line 41a through the first selection transistor 25a, and a pixel signal corresponding to the electric charge generated in the photodiode 21b-1 is outputted to the vertical signal line 42 through the third selection transistor 30.

Then, similarly, the reset signal RST and the transfer signals TG2 to TG4 sequentially go high in a pulsatile manner. Consequently, a pixel signal corresponding to the electric charge generated in the photodiodes 21a-2 to 21a-4 is outputted to the vertical signal line 41a through the first selection transistor 25a, and a pixel signal corresponding to the electric charge generated in the photodiodes 21b-2 to 21b-4 is outputted to the vertical signal line 42 through the third selection transistor 30. Subsequently, the selection signals SEL1 and SEL3 go low.

FIG. 10 is a diagram illustrating an example of a drive signal for the imaging element 11_2 in the SF addition driving state.

In the SF addition driving state, when it is time to read out the pixel signals from the shared pixel units 13a_2 and 13b_2, the selection signals SEL2 and SEL3 go high so as to turn on the second selection transistor 26a and the third selection transistor 30. Stated differently, in the SF addition driving state, the selection signal SEL3 has the same waveform as the selection signal SEL2. It should be noted that the selection signal SEL1 remains low in the SF addition driving state.

When the selection signals SEL2 and SEL3 go high, the reset transistors 27a and 27b are turned on in accordance with the reset signal RST, which goes high in a pulsatile manner, and the electric charge accumulated in the main FD sections 23a and 23b is discharged to the power supply wiring 43. Consequently, a pixel signal in the reset state is outputted to the vertical signal line 42 through the second selection transistor 26a and is simultaneously outputted to the vertical signal line 42 through the third selection transistor 30. Then, source follower addition is performed on such outputted pixel signals.

Subsequently, the transfer transistors 22a-1 and 22b-1 are turned on in accordance with the transfer signal TG1, which goes high in a pulsatile manner. Then, the electric charge accumulated in the photodiode 21a-1 is transferred to the main FD section 23a, and the electric charge accumulated in the photodiode 21b-1 is transferred to the main FD section 23b. Consequently, a pixel signal corresponding to the electric charge generated in the photodiode 21a-1 is outputted to the vertical signal line 42 through the second selection transistor 26a, and a pixel signal corresponding to the electric charge generated in the photodiode 21b-1 is simultaneously outputted to the vertical signal line 42 through the third selection transistor 30. Then, source follower addition is performed on such outputted pixel signals.

Then, similarly, the reset signal RST and the transfer signals TG2 to TG4 sequentially go high in a pulsatile manner. Consequently, a pixel signal corresponding to the electric charge generated in the photodiodes 21a-2 to 21a-4 and a pixel signal corresponding to the electric charge generated in the photodiodes 21b-2 to 21b-4 are simultaneously outputted at respective time points. Then, source follower addition is performed on such outputted pixel signals. Subsequently, the selection signals SEL2 and SEL3 go low.

Figure 11:
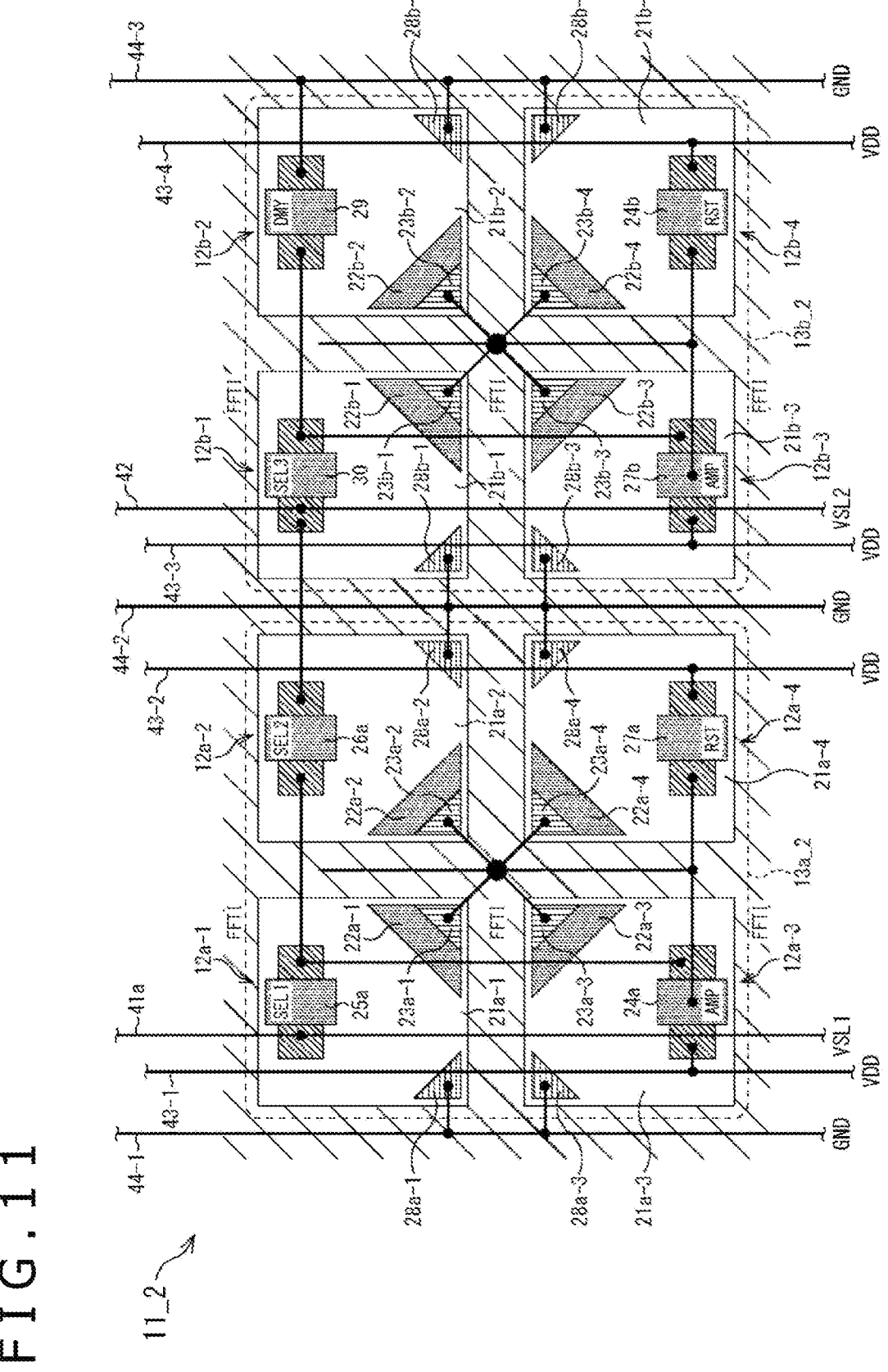
FIG. 11 is a diagram illustrating an example of the first planar layout of the imaging element depicted in FIG. 8.

FIG. 11 is a diagram illustrating an example of the first planar layout of the imaging element 11_2.

In the first planar layout of the imaging element 11_2 depicted in FIG. 11, four pixels 12-1 to 12-4 forming a shared pixel unit 13_2 are arranged in a 2×2 array, as is the case with the first planar layout of the imaging element 11 depicted in FIG. 4, which is described earlier.

In the imaging element 11_2, the vertical signal line 42 can be disposed in the center between the shared pixel units 13a_2 and 13b_2, and the vertical signal line 41a can be disposed near the outside, as is the case with the imaging element 11. Therefore, the imaging element 11_2 is able to inhibit the occurrence of interference between the vertical signal lines 41a and 42.

Figure 12:
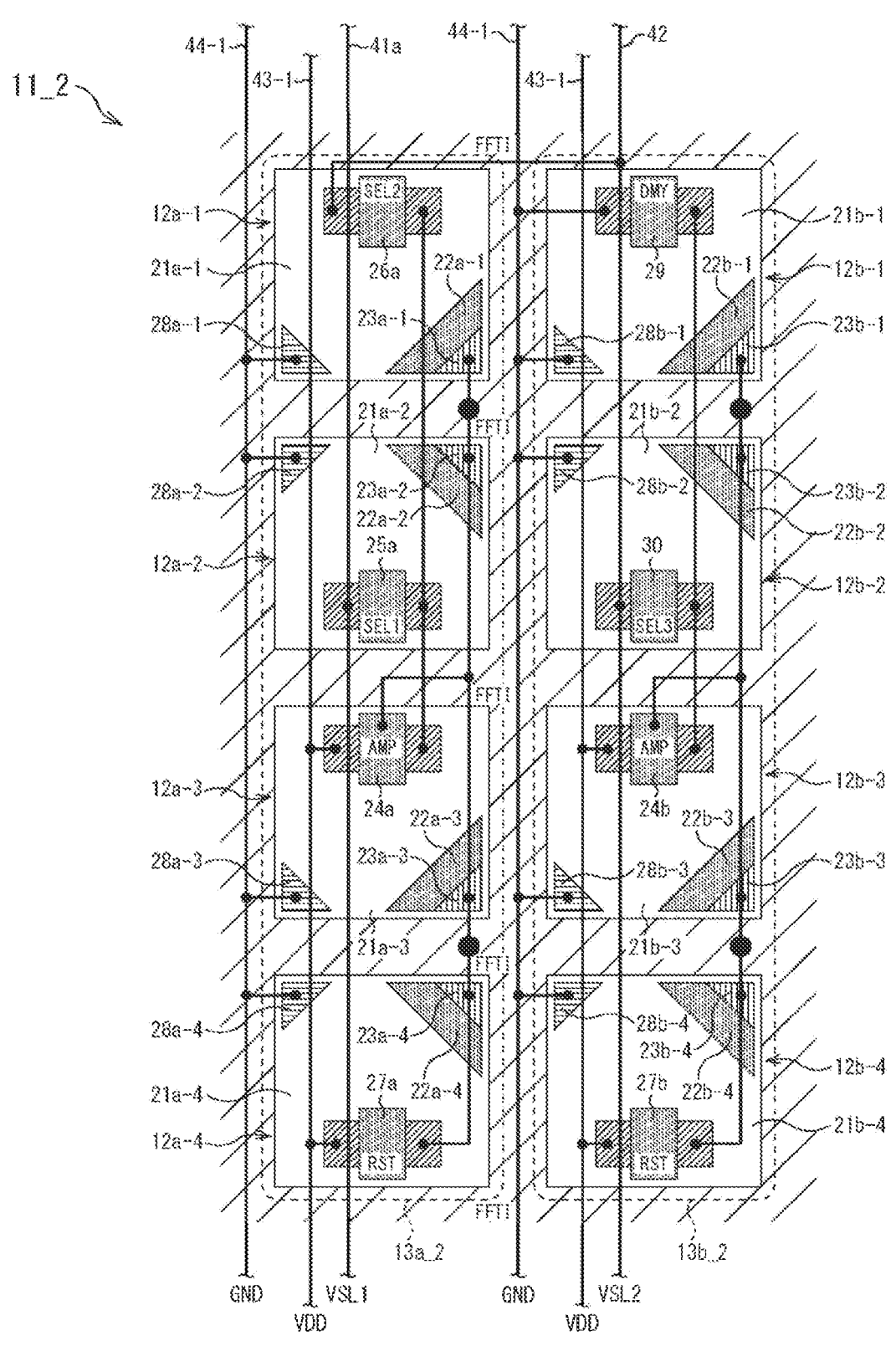
FIG. 12 is a diagram illustrating an example of the second planar layout of the imaging element depicted in FIG. 8.

FIG. 12 is a diagram illustrating an example of the second planar layout of the imaging element 11_2.

In the second planar layout of the imaging element 11_2 depicted in FIG. 12, four pixels 12-1 to 12-4 forming the shared pixel unit 13_2 are arranged in a 1×4 array, as is the case with the second planar layout of the imaging element 11 depicted in FIG. 5, which is described earlier. Further, the shared pixel units 13a_2 and 13b_2 are disposed adjacent to each other in the horizontal direction.

The imaging element 11_2 configured as described above is able to achieve higher performance, as is the case with the imaging element 11 depicted in FIG. 1.

Third Example Configuration of Imaging Element

FIG. 13 is a circuit diagram illustrating an example of the configuration of a third embodiment of the imaging element to which the present technology is applied. Components of the imaging element 11_3 depicted in FIG. 13 that are similar to the components of the imaging element 11 depicted in FIG. 1 are designated by the same reference signs as the corresponding components and will not be redundantly described in detail.

As depicted in FIG. 13, the imaging element 11_3 is configured such that shared pixel units 13a_3 and 13b_3 are adjacent to each other in the horizontal direction, as is the case with the imaging element 11 depicted in FIG. 1. Further, the shared pixel units 13a_3 and 13b_3 have the same structure. In a case where there is no need to distinguish between the shared pixel units 13a_3 and 13b_3, each of them is referred to as the shared pixel unit 13_3, and this similarly applies to each part included in the shared pixel unit 13_3.

The configuration of the shared pixel unit 13_3 is the same as the configuration of the shared pixel unit 13 depicted in FIG. 1 in that the former includes the main FD section 23, the amplification transistor 24, the first selection transistor 25, the second selection transistor 26, and the reset transistor 27. However, the configuration of the shared pixel unit 13_3 is different from the configuration of the shared pixel unit 13 depicted in FIG. 1 in that the former includes eight photodiodes 21-1 to 21-8, eight transfer transistors 22-1 to 22-8, a connection transistor 31, and a sub-FD section 32.

The connection transistor 31 connects the main FD section 23 and the sub-FD section 32 in accordance with a connection signal FDG. When connected to the main FD section 23 through the connection transistor 31, the sub-FD section 32 accumulates electric charge together with the main FD section 23.

For example, in a case where the connection transistor 31 is off, the wiring capacitance and diffusion layer capacitance of the main FD section 23 and the gate capacitance of the amplification transistor 24 constitute FD capacitance. Meanwhile, in a case where the connection transistor 31 is on, the wiring capacitance and diffusion layer capacitance of the main FD section 23, the gate capacitance of the amplification transistor 24, the wiring capacitance and diffusion layer capacitance of the sub-FD section 32, and the bulk capacitance of the connection transistor 31 constitute the FD capacitance.

Consequently, when the amplification transistor 24 reduces the efficiency of converting electric charge into a pixel signal in a case, for example, where a bright subject is imaged, the shared pixel unit 13_3 is able to increase the load capacitance provided by the main FD section 23 and the sub-FD section 32 by turning on the connection transistor 31.

FIG. 14 is a diagram illustrating an example of the planar layout of the imaging element 11_3.

As depicted in FIG. 14, eight pixels 12-1 to 12-8 forming the shared pixel unit 13_3 are arranged in a 2×4 array. Further, in the imaging element 11_3, the shared pixel unit 13a_3 and the shared pixel unit 13b_3, which are disposed adjacent to each other in the horizontal direction, have the same transistor arrangement.

In the shared pixel unit 13_3, in order to increase the channel width W of a transistor, the amplification transistor 24, the first selection transistor 25, and the second selection transistor 26 each include two transistors that are arranged in parallel. For example, an amplification transistor 24-1 provided in the photodiode 21-5 and an amplification transistor 24-2 provided in the photodiode 21-6 are arranged in parallel. Further, a first selection transistor 25-1 provided in the photodiode 21-3 and a first selection transistor 25-2 provided in the photodiode 21-4 are arranged in parallel. Furthermore, a second selection transistor 26-1 provided in the photodiode 21-1 and a second selection transistor 26-2 provided in the photodiode 21-2 are arranged in parallel. It should be noted that the sub-FD section 32 to be connected to the connection transistor 31 is not depicted in FIG. 14.

The imaging element 11_3 configured as described above is able to achieve higher performance, as is the case with the imaging element 11 depicted in FIG. 1. Further, when provided with the sub-FD section 32, the imaging element 11_3 is able, for example, to expand the dynamic range.

Fourth Example Configuration of Imaging Element

FIG. 15 is a circuit diagram illustrating an example of the configuration of a fourth embodiment of the imaging element to which the present technology is applied. Components of the imaging element 11_4 depicted in FIG. 15 that are similar to the components of the imaging element 11 depicted in FIG. 1 and the components of the imaging element 11_3 depicted in FIG. 13 are designated by the same reference signs as the corresponding components and will not be redundantly described in detail.

As depicted in FIG. 15, the imaging element 11_4 is configured such that shared pixel units 13a_4 and 13b_4 are adjacent to each other in the horizontal direction, as is the case with the imaging element 11 depicted in FIG. 1. For example, the shared pixel unit 13a_4 has the same configuration as the shared pixel unit 13a_3 depicted in FIG. 13, and the shared pixel unit 13b_4 has the dummy transistor 29 and the third selection transistor 30, as is the case with the shared pixel unit 13b_2, which has been described with reference to FIG. 8.

Consequently, as is the case with the imaging element 11_3 depicted in FIG. 13, the imaging element 11_4 is able to increase the load capacitance provided by the main FD section 23 and the sub-FD section 32 by turning on the connection transistor 31.

FIG. 16 is a diagram illustrating an example of the planar layout of the imaging element 11_4.

As depicted in FIG. 16, eight pixels 12-1 to 12-8 forming a shared pixel unit 13_4 are arranged in a 2×4 array. Further, in the imaging element 11_3, the shared pixel unit 13a_3 and the shared pixel unit 13b_3, which are disposed adjacent to each other in the horizontal direction, have the same transistor arrangement.

The imaging element 11_4 configured as described above is able to achieve higher performance, as is the case with the imaging element 11 depicted in FIG. 1. Further, when provided with the sub-FD section 32, the imaging element 11_4 is able, for example, to expand the dynamic range.

Example Configuration of Electronic Equipment

The imaging element 11 described above is applicable, for example, to various types of electronic equipment such as an imaging system formed, for instance, by a digital still camera or a digital video camera, a mobile phone having an imaging function, and other equipment having the imaging function.

Figure 17:
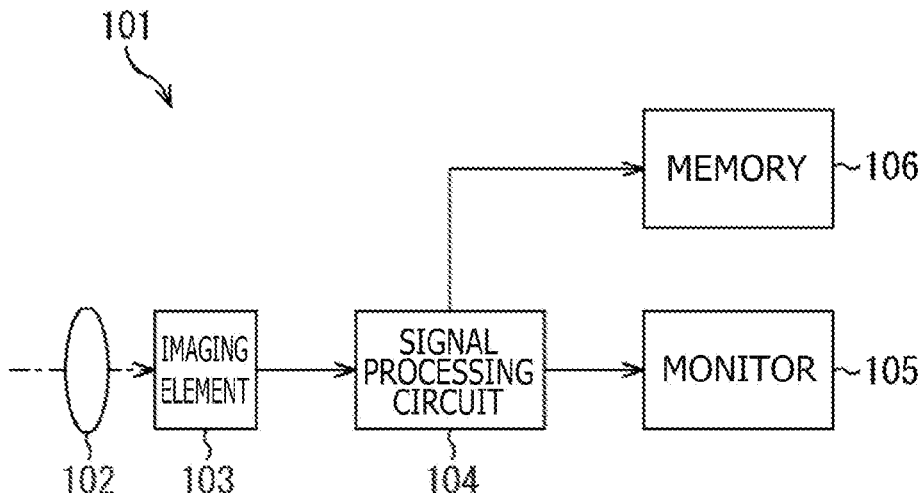
FIG. 17 is a block diagram illustrating an example of the configuration of an imaging device.

FIG. 17 is a block diagram illustrating an example of the configuration of an imaging device mounted in the electronic equipment.

As depicted in FIG. 17, the imaging device 101 includes an optical system 102, an imaging element 103, a signal processing circuit 104, a monitor 105, and a memory 106, and is able to capture still images and moving images.

The optical system 102 includes one or a plurality of lenses, guides image light (incident light) from a subject to the imaging element 103, and forms an image on the light-receiving surface (sensor section) of the imaging element 103.

As the imaging element 103, the imaging element 11 described above is applied. Electrons are accumulated in the imaging element 103 for a certain period of time according to the image that is formed on the light-receiving surface through the optical system 102. A signal corresponding to the electrons accumulated in the imaging element 103 is then supplied to the signal processing circuit 104.

The signal processing circuit 104 performs various types of signal processing on pixel signals outputted from the imaging element 103. Images (image data) obtained by signal processing performed by the signal processing circuit 104 is supplied to the monitor 105 and displayed, or supplied to the memory 106 and stored (recorded).

When the above-mentioned imaging element 11 is applied to the imaging device 101 configured as described above, it is possible to capture, for example, higher-quality images.

Examples of Use of Image Sensor

Figure 18:
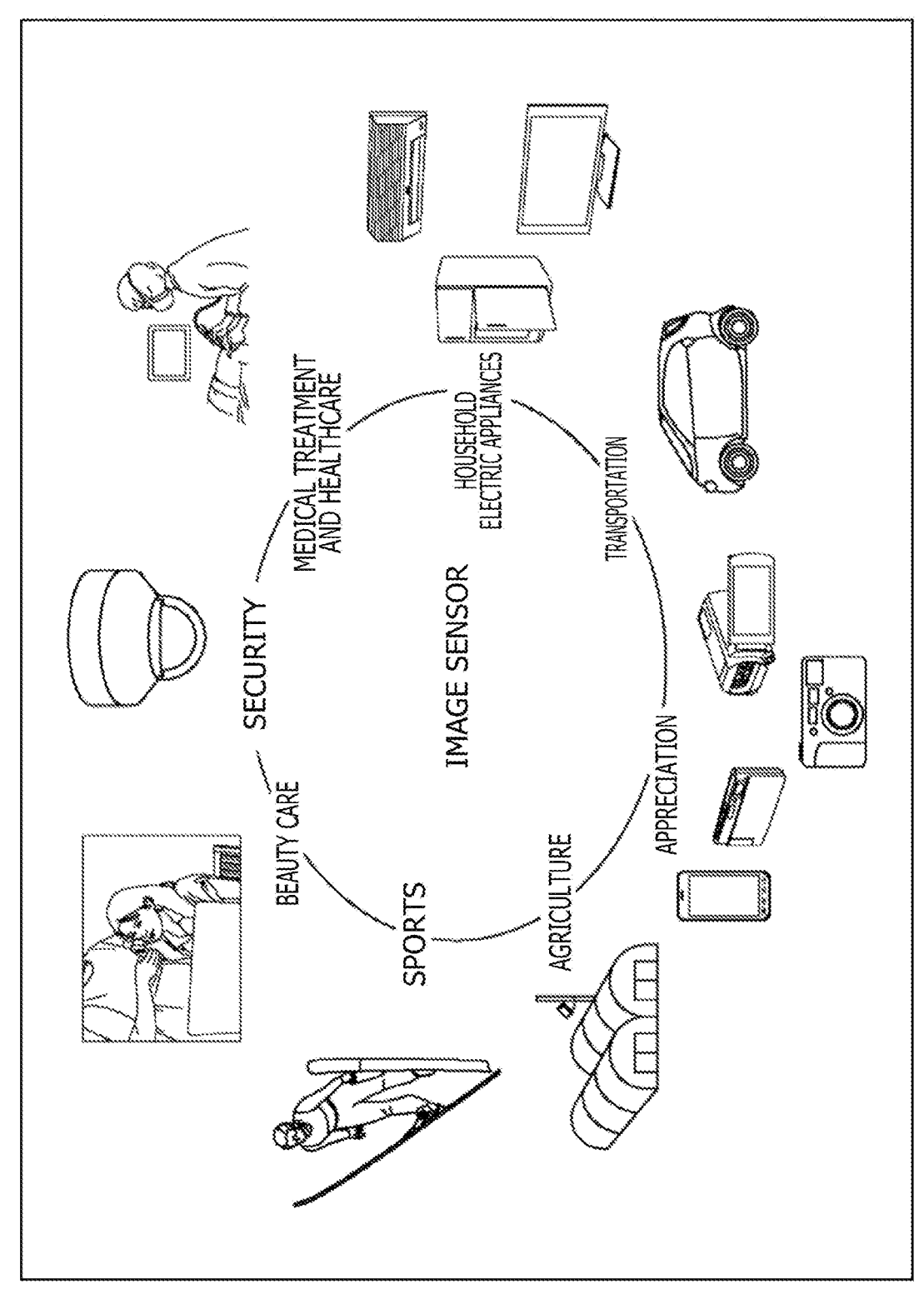
FIG. 18 is a diagram illustrating the examples of use of an image sensor.

FIG. 18 is a diagram illustrating examples of use of the above-mentioned image sensor (imaging element).

The above-mentioned image sensor can be used in various cases where, for example, visible light, infrared light, ultraviolet light, X-ray light, or other light is to be sensed as described below.

A device used to capture images for appreciation, such as a digital camera or a mobile device with a camera function A device used during transportation, for example, to provide an automatic stop feature and other safety driving features and recognize the status of a driver of a vehicle, such as a vehicle-mounted sensor for capturing an image depicting, for instance, a forward or rearward view from the vehicle, a view around the vehicle, or the interior of the vehicle, a surveillance camera for monitoring traveling vehicles and roads, or a distance measurement sensor for measuring, for example, an inter-vehicle distance A device used with a TV set, a refrigerator, an air conditioner, or other household electric appliance in order to capture an image of a user's gesture and perform equipment operation according to the gesture A device used for medical treatment or healthcare such as an endoscope or an angiographic device adapted to receive infrared light A device used for security purposes, such as a surveillance camera for crime prevention or a camera for personal authentication A device used for beauty care, such as a skin measuring instrument for capturing an image of skin or a microscope for capturing an image of a scalp A device used for sports, such as an action camera or a wearable camera for sporting and other events A device used for agriculture, such as a camera for monitoring the status of farms and farm products Example Combinations of Configurations It should be noted that the present technology can also adopt the following configurations.

(1)

A solid-state imaging element including:

shared pixel units that are disposed adjacent to each other in a horizontal direction and configured to allow a plurality of pixels to share an FD (Floating Diffusion) section and an amplification transistor, in which the shared pixel units each include a first selection transistor that connects the amplification transistor to a first vertical signal line, the first vertical signal line being used when pixel signals are outputted independently for each of the pixels, and a second selection transistor that connects the amplification transistor to a second vertical signal line, the second vertical signal line being used when source follower addition is performed to output the pixel signals.

(2)

The solid-state imaging element according to (1) above, in which two of the shared pixel units disposed adjacent to each other in the horizontal direction are configured such that transistors are arranged symmetrically in the horizontal direction.

(3)

The solid-state imaging element according to (2) above, in which the shared pixel units are configured such that the pixels are arranged in a 2×2 array, and the second vertical signal line is disposed in the center between the shared pixel units, and the first vertical signal line is disposed near the outside.

(4)

The solid-state imaging element according to (2) or (3) above, in which an on-chip lens is disposed for each of the sixteen pixels for which the shared pixel units having the pixels arranged in a 2×2 array are arranged in a 2×2 array, and

a planar layout is adopted in such a manner that the shared pixel units arranged in a vertical direction have the same transistor arrangement.

(5)

The solid-state imaging element according to (2) or (3) above, in which an on-chip lens is disposed for the sixteen pixels for which the shared pixel units having the pixels arranged in a 2×2 array are arranged in a 2×2 array, and a planar layout is adopted in such a manner that the shared pixel units arranged in the vertical direction have transistors arranged symmetrically in the vertical direction.

(6)

The solid-state imaging element according to any one of (1) to (5) above, in which one of the two shared pixel units disposed adjacent to each other in the horizontal direction includes the first selection transistor and the second selection transistor, and the other one of the two shared pixel units disposed adjacent to each other in the horizontal direction includes a dummy transistor in place of the first selection transistor, and a third selection transistor in place of the second selection transistor, the third selection transistor being driven in a manner same as the first selection transistor when the pixel signals are outputted independently for each of the pixels and being driven in a manner same as the second selection transistor when source follower addition is performed to output the pixel signals.

(7)

The solid-state imaging element according to any one of (1) to (6) above, further including:

a sub-FD section that is connected to the FD section through a connection transistor.

(8)

Electronic equipment including:

a solid-state imaging element that includes shared pixel units, the shared pixel units being disposed adjacent to each other in a horizontal direction and configured to allow a plurality of pixels to share an FD (Floating Diffusion) section and an amplification transistor, in which the shared pixel units each include a first selection transistor that connects the amplification transistor to a first vertical signal line, the first vertical signal line being used when pixel signals are outputted independently for each of the pixels, and a second selection transistor that connects the amplification transistor to a second vertical signal line, the second vertical signal line being used when source follower addition is performed to output the pixel signals.

It should be noted that the embodiments of the present disclosure are not limited to the foregoing embodiments and may be variously modified without departing from the spirit and scope of the present disclosure. Further, advantages described in this document are merely illustrative and not restrictive. The present disclosure can additionally provide advantages other than those described in this document.

REFERENCE SIGNS LIST

11: Imaging element
12: Pixel

13: Shared pixel unit
21: Photodiode
22: Transfer transistor
23: Main FD section
24: Amplification transistor
25: First selection transistor
26: Second selection transistor
27: Reset transistor
28: P+ type region
29: Dummy transistor
30: Third selection transistor
31: Connection transistor
32: Sub-FD section
41, 42: Vertical signal line
43: Power supply wiring
44: Wiring

The invention claimed is:

1. A solid-state imaging element, comprising:
a plurality of pixel units in a horizontal direction, wherein
    a first pixel unit of the plurality of pixel units is adjacent
      to a second pixel unit of the plurality of pixel units
      in the horizontal direction,
    the first pixel unit includes:
      a plurality of pixels;
      a Floating Diffusion (FD) section;
      an amplification transistor, wherein the plurality of
        pixels is configured to share the FD section and
        the amplification transistor;
      a first selection transistor configured to connect the
        amplification transistor to a first vertical signal
        line,
        wherein the first vertical signal line is configured
          to output a plurality of pixel signals from the
          plurality of pixels, in a case where each pixel
          signal of the plurality of pixel signals is out-
          putted independently for each of the plurality of
          pixels; and
    a second selection transistor configured to connect the
      amplification transistor to a second vertical signal
      line,
      the second vertical signal line is configured to output
        the plurality of pixel signals, in a case where the
        plurality of pixel signals are added based on a
        source follower addition process, and a third pixel
        unit of the plurality of the pixel units includes:
      a dummy transistor in place of the first selection
        transistor; and
      a third selection transistor in place of the second
        selection transistor, wherein
        in the case where the each pixel signal of the
          plurality of pixel signals is outputted indepen-
          dently for the each of the plurality of pixels, the
          third selection transistor is driven same as the
          first selection transistor, and
        in the case where the plurality of pixel signals are
          added based on the source follower addition
          process, the third selection transistor is driven
          same as the second selection transistor.

2. The solid-state imaging element according to claim 1,
wherein
    a plurality of transistors in each of the first pixel unit and
      the second pixel unit is in a mirror-symmetrical
      arrangement in the horizontal direction, and
    the plurality of transistors includes each of the amplifi-
      cation transistor, the first selection transistor, and the
      second selection transistor.

3. The solid-state imaging element according to claim 2,
wherein
    the plurality of pixels is in a 2×2 array, and
    the second vertical signal line is at a center of a space
      between the first pixel unit and the second pixel unit,
      and
    the first vertical signal line is outside of the space between
      the first pixel unit and the second pixel unit.

4. The solid-state imaging element according to claim 2,
further comprising an on-chip lens for the each of the
plurality of pixels, wherein
    the plurality of pixel units is in a 2×2 array,
    the plurality of pixels is in the 2×2 array, and
    the plurality of pixel units is in a planar layout in which
      the plurality of pixel units in a vertical direction has
      same transistor arrangement of the plurality of transis-
      tors.

5. The solid-state imaging element according to claim 2,
further comprising an on-chip lens for the plurality of pixels,
wherein
    the plurality of pixel units is in a 2×2 array,
    the plurality of pixels is in the 2×2 array, and
    the plurality of pixel units is in a planar layout in which
      the plurality of transistors is in the mirror-symmetrical
      arrangement in a vertical direction.

6. The solid-state imaging element according to claim 1,
further comprising a sub-FD section configured to connect
to the FD section via a connection transistor.

7. An electronic equipment, comprising:
a solid-state imaging element that includes a plurality of
    pixel units, wherein
    a first pixel unit of the plurality of pixel units is adjacent
      to a second pixel unit of the plurality of pixel units
      in the horizontal direction,
    the first pixel unit includes:
      a plurality of pixels;
      a Floating Diffusion (FD) section;
      an amplification transistor, wherein the plurality of
        pixels is configured to share the FD section and
        the amplification transistor;
      a first selection transistor configured to connect the
        amplification transistor to a first vertical signal
        line,
        wherein the first vertical signal line is configured
          to output a plurality of pixel signals from the
          plurality of pixels, in a case where each pixel
          signal of the plurality of pixel signals is out-
          putted independently for each of the plurality of
          pixels; and
    a second selection transistor configured to connect the
      amplification transistor to a second vertical signal
      line,
      the second vertical signal line is configured to output
        the plurality of pixel signals, in a case where the
        plurality of pixel signals are added based on a
        source follower addition process, and a third pixel
        unit of the plurality of the pixel units includes:
      a dummy transistor in place of the first selection
        transistor; and
      a third selection transistor in place of the second
        selection transistor, wherein
        in the case where the each pixel signal of the
          plurality of pixel signals is outputted indepen-
          dently for the each of the plurality of pixels, the
          third selection transistor is driven same as the
          first selection transistor, and in the case where the plurality of pixel signals are added based on the source follower addition process, the third selection transistor is driven same as the second selection transistor.

* * * * *